US012598727B2

(12) United States Patent
O'Connor

(10) Patent No.: US 12,598,727 B2
(45) Date of Patent: Apr. 7, 2026

(54) DOUBLE SIDED DISPLAY ASSEMBLY WITH BI-DIRECTIONAL FLOW THROUGH A COMMON, PARTITIONED HEAT EXCHANGER

(71) Applicant: Manufacturing Resources International, Inc., Alpharetta, GA (US)

(72) Inventor: Kevin O'Connor, Duluth, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 234 days.

(21) Appl. No.: 18/408,317

(22) Filed: Jan. 9, 2024

(65) Prior Publication Data

US 2025/0227902 A1     Jul. 10, 2025

(51) Int. Cl.
*H05K 7/20* (2006.01)
*G09F 9/302* (2006.01)

(52) U.S. Cl.
CPC ......... *H05K 7/20972* (2013.01); *G09F 9/302* (2013.01); *H05K 7/20436* (2013.01)

(58) Field of Classification Search
CPC ........... H05K 7/20954; H05K 7/20972; H05K 7/20963; H05K 7/20436; G09F 9/302
See application file for complete search history.

(56) References Cited

U.S. PATENT DOCUMENTS 4,093,355 A     6/1978   Kaplit et al.
4,292,370 A     9/1981   Pekko 4,327,803 A     5/1982   Muellejans et al.
4,488,193 A     12/1984  Davis et al.
4,593,978 A     6/1986   Mourey et al.
4,634,225 A     1/1987   Haim et al.
(Continued)

FOREIGN PATENT DOCUMENTS

AU     2011248190 B2     5/2011
AU     2014287438 B2     1/2018
(Continued)

OTHER PUBLICATIONS

ITSENCLOSURES, Product Catalog, 2009, 48 pages.
(Continued)

*Primary Examiner* — Jayprakash N Gandhi
*Assistant Examiner* — Matthew Sinclair Muir
(74) *Attorney, Agent, or Firm* — Standley Law Group LLP; Jeffrey S. Standley; Adam J. Smith

(57)     ABSTRACT

Display assemblies with bi-directional flow through a common, partition heat exchanger are provided. Side assemblies are connected to a structural framework and include a cover, an electronic display, and one or more channels. A heat exchanger is positioned between the side assemblies and within the structural framework. A closed loop airflow pathway includes a first portion including at least one of the channels of the first side assembly, a second portion including a first portion of the heat exchanger, distal from the first side assembly, a third portion including at least one of the channels of the second side assembly, and a fourth portion extending to the first portion and including a second portion of the heat exchanger, distal from the second side assembly.

19 Claims, 4 Drawing Sheets

(56)  References Cited

U.S. PATENT DOCUMENTS

| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |

(56) References Cited

U.S. PATENT DOCUMENTS

| | | |
|---|---|---|
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 * | 10/2015 | Dunn ............... G02F 1/133603 |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,206,750 B2 | 12/2021 | Lee et al. |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 11,744,036 B2 | 8/2023 | Diaz |
| 11,744,054 B2 | 8/2023 | Dunn et al. |
| 11,762,231 B2 | 9/2023 | Dunn et al. |
| 11,822,171 B2 | 11/2023 | Dunn et al. |
| 12,010,824 B2 * | 6/2024 | Dunn ............... G02F 1/133385 |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0135741 A1 | 9/2002 | Lee et al. |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0223299 A1 | 11/2004 | Ghosh |
| 2005/0012039 A1 | 1/2005 | Faytlin et al. |

(56) References Cited

U.S. PATENT DOCUMENTS

| | | |
|---|---|---|
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0221270 A1 | 10/2006 | Ioki et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0266900 A1 | 11/2006 | May et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055261 A1 | 3/2008 | Cernasov |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0148609 A1 | 6/2008 | Ogoreve |
| 2008/0165496 A1 | 7/2008 | Kang et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn ................. H05K 7/20972 361/695 |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |

(56) References Cited

U.S. PATENT DOCUMENTS

| | | |
|---|---|---|
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0299651 A1 | 11/2013 | McGowan et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0087404 A1 | 3/2015 | Lesley et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |
| 2016/0014910 A1 | 1/2016 | Campagna et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0020579 A1 | 1/2018 | Chang et al. |

| | | | |
|---|---|---|---|
| 2018/0042134 A1 | 2/2018 | Dunn et al. | |
| 2018/0088368 A1 | 3/2018 | Notoshi et al. | |
| 2018/0088398 A1 | 3/2018 | Lee et al. | |
| 2018/0116073 A1 | 4/2018 | Dunn | |
| 2018/0199450 A1 | 7/2018 | Kim et al. | |
| 2018/0259806 A1 | 9/2018 | Oh et al. | |
| 2018/0263142 A1 | 9/2018 | Oh et al. | |
| 2018/0310439 A1 | 10/2018 | Oh et al. | |
| 2018/0314103 A1 | 11/2018 | Dunn et al. | |
| 2018/0315356 A1 | 11/2018 | Dunn et al. | |
| 2018/0317330 A1 | 11/2018 | Dunn et al. | |
| 2018/0317350 A1 | 11/2018 | Dunn et al. | |
| 2018/0364519 A1 | 12/2018 | Dunn et al. | |
| 2019/0021189 A1 | 1/2019 | Kim et al. | |
| 2019/0037738 A1 | 1/2019 | Dunn et al. | |
| 2019/0089176 A1 | 3/2019 | Dunn et al. | |
| 2019/0133002 A1 | 5/2019 | Dunn et al. | |
| 2019/0159363 A1 | 5/2019 | Jang et al. | |
| 2019/0208674 A1 | 7/2019 | Demars | |
| 2019/0239365 A1 | 8/2019 | Dunn et al. | |
| 2019/0289754 A1 | 9/2019 | Hubbard | |
| 2019/0327865 A1 | 10/2019 | Dunn et al. | |
| 2020/0096797 A1 | 3/2020 | Teragawa | |
| 2020/0154597 A1 | 5/2020 | Dunn et al. | |
| 2020/0163235 A1 | 5/2020 | Dunn | |
| 2020/0201402 A1 | 6/2020 | Lee et al. | |
| 2020/0205303 A1 | 6/2020 | Dunn et al. | |
| 2020/0241612 A1 | 7/2020 | Moon et al. | |
| 2020/0253095 A1 | 8/2020 | Dunn et al. | |
| 2020/0275585 A1 | 8/2020 | Dunn | |
| 2020/0288585 A1 | 9/2020 | Dunn et al. | |
| 2020/0319676 A1 | 10/2020 | Dunn | |
| 2020/0352049 A1 | 11/2020 | Dunn et al. | |
| 2020/0367391 A1 | 11/2020 | Dunn | |
| 2020/0369169 A1 | 11/2020 | Mercer et al. | |
| 2020/0387194 A1 | 12/2020 | Dunn | |
| 2020/0390009 A1* | 12/2020 | Whitehead | G09F 9/3026 |
| 2021/0007241 A1 | 1/2021 | Diaz | |
| 2021/0022273 A1 | 1/2021 | Hubbard | |
| 2021/0165472 A1 | 6/2021 | Chin | |
| 2021/0168949 A1 | 6/2021 | Dunn et al. | |
| 2021/0231998 A1 | 7/2021 | Noso et al. | |
| 2021/0243906 A1 | 8/2021 | Dunn | |
| 2021/0243914 A1 | 8/2021 | Dunn | |
| 2021/0304644 A1 | 9/2021 | Webster | |
| 2021/0307214 A1 | 9/2021 | Zhang et al. | |
| 2021/0345528 A1 | 11/2021 | Dunn | |
| 2021/0400853 A1 | 12/2021 | Choi | |
| 2021/0408676 A1 | 12/2021 | Sainz Fuertes | |
| 2022/0035198 A1 | 2/2022 | Dunn et al. | |
| 2022/0110227 A1 | 4/2022 | Brown | |
| 2022/0121255 A1 | 4/2022 | Wang et al. | |
| 2022/0132707 A1 | 4/2022 | Dunn et al. | |
| 2022/0287200 A1 | 9/2022 | Dunn et al. | |
| 2022/0394861 A1 | 12/2022 | Dunn et al. | |
| 2022/0408616 A1 | 12/2022 | Brown | |
| 2022/0408617 A1 | 12/2022 | Brown | |
| 2023/0029615 A1* | 2/2023 | Dunn | G02F 1/133385 |
| 2023/0030742 A1 | 2/2023 | Dunn et al. | |
| 2023/0032626 A1 | 2/2023 | Brown | |
| 2023/0033017 A1 | 2/2023 | Dunn | |
| 2023/0036767 A1 | 2/2023 | Dunn et al. | |
| 2023/0056061 A1 | 2/2023 | Dunn et al. | |
| 2023/0059819 A1 | 2/2023 | Dunn et al. | |
| 2023/0164964 A1 | 5/2023 | Dunn et al. | |
| 2023/0200031 A1 | 6/2023 | Dunn | |
| 2023/0209786 A1 | 6/2023 | Dunn | |
| 2023/0345683 A1 | 10/2023 | Dunn et al. | |
| 2023/0359077 A1 | 11/2023 | Dunn et al. | |
| 2023/0422431 A1 | 12/2023 | Dunn et al. | |
| 2023/0422453 A1 | 12/2023 | Dunn | |

FOREIGN PATENT DOCUMENTS

| | | | |
|---|---|---|---|
| AU | 2015253128 B2 | 3/2018 | |
| AU | 2017216500 B2 | 10/2018 | |
| AU | 2015229457 B2 | 3/2019 | |
| AU | 2016220308 B2 | 3/2019 | |
| AU | 2017228430 B2 | 3/2020 | |

(56) References Cited

FOREIGN PATENT DOCUMENTS

| | | | |
|---|---|---|---|
| AU | 2018258497 B2 | 1/2021 | |
| AU | 2018257648 B2 | 2/2021 | |
| BR | PI0820231-1 | 2/2019 | |
| CA | 2705814 C | 2/2018 | |
| CA | 2947524 C | 4/2018 | |
| CA | 2915261 C | 8/2018 | |
| CA | 2798277 C | 6/2019 | |
| CA | 2809019 C | 9/2019 | |
| CA | 2888494 C | 9/2019 | |
| CA | 2976116 C | 11/2020 | |
| CA | 3015365 C | 8/2021 | |
| CA | 3059972 C | 1/2022 | |
| CA | 2942321 C | 6/2022 | |
| CA | 3059928 C | 11/2022 | |
| CN | 2702363 Y | 5/2005 | |
| CN | 201228893 Y | 4/2009 | |
| CN | 202838830 U | 3/2013 | |
| CN | 106304788 A | 1/2017 | |
| CN | 107251671 A | 10/2017 | |
| CN | 108700739 A | 10/2018 | |
| CN | 107251671 B | 8/2019 | |
| CN | 216697703 U | 6/2022 | |
| EP | 1408476 A1 | 4/2004 | |
| EP | 1647766 A2 | 4/2006 | |
| EP | 1722559 A1 | 11/2006 | |
| EP | 1762892 A1 | 3/2007 | |
| EP | 1951020 A1 | 7/2008 | |
| EP | 2225603 A2 | 9/2010 | |
| EP | 2370987 A2 | 10/2011 | |
| EP | 2587175 A1 | 5/2013 | |
| EP | 2603831 A2 | 6/2013 | |
| EP | 2801888 A2 | 11/2014 | |
| EP | 2909829 A1 | 8/2015 | |
| EP | 3020260 A2 | 5/2016 | |
| EP | 3040766 A1 | 7/2016 | |
| EP | 3117693 A2 | 1/2017 | |
| EP | 3259968 A1 | 12/2017 | |
| EP | 3423886 | 1/2019 | |
| EP | 3468321 A1 | 4/2019 | |
| EP | 3138372 B1 | 5/2019 | |
| EP | 3117693 B1 | 8/2019 | |
| EP | 2567283 B1 | 10/2019 | |
| EP | 2909829 B1 | 2/2020 | |
| EP | 3615978 A1 | 3/2020 | |
| EP | 3616481 A1 | 3/2020 | |
| EP | 3624574 A1 | 3/2020 | |
| EP | 3468321 B1 | 4/2021 | |
| EP | 3423886 B1 | 2/2022 | |
| EP | 3259968 B1 | 4/2022 | |
| EP | 4232870 A1 | 8/2023 | |
| EP | 3615978 B1 | 1/2024 | |
| GB | 2402205 A | 12/2004 | |
| JP | 402062015 A | 3/1990 | |
| JP | 402307080 A | 12/1990 | |
| JP | 3153212 A | 7/1991 | |
| JP | H06-2337 U | 1/1994 | |
| JP | 6082745 A | 3/1994 | |
| JP | H8-54834 A | 2/1996 | |
| JP | H8-55567 A | 2/1996 | |
| JP | 8115788 A | 5/1996 | |
| JP | H8-152604 A | 6/1996 | |
| JP | 8194437 A | 7/1996 | |
| JP | H08-305301 A | 11/1996 | |
| JP | 8339034 A | 12/1996 | |
| JP | H9-160512 A | 6/1997 | |
| JP | H09246766 A | 9/1997 | |
| JP | H11-68363 A | 3/1999 | |
| JP | 11160727 A | 6/1999 | |
| JP | H11296094 A | 10/1999 | |
| JP | 2000-10501 A | 1/2000 | |
| JP | 2000131682 A | 5/2000 | |
| JP | 3118907 B2 | 10/2000 | |
| JP | 2001209126 A | 8/2001 | |
| JP | 2002-6282 A | 1/2002 | |
| JP | 2002158475 A | 5/2002 | |
| JP | 2003-76286 A | 3/2003 | |
| JP | 2003-162228 A | 6/2003 | |
| JP | 2004053749 A | 2/2004 | |
| JP | 2004-199675 A | 7/2004 | |
| JP | 2004286940 A | 10/2004 | |
| JP | 2005017556 A | 1/2005 | |
| JP | 2005134849 A | 5/2005 | |
| JP | 2005265922 A | 9/2005 | |
| JP | 2006-32890 A | 2/2006 | |
| JP | 2006513577 A | 4/2006 | |
| JP | 2006148047 A | 6/2006 | |
| JP | 2006163217 A | 6/2006 | |
| JP | 2006-176112 A | 7/2006 | |
| JP | 2006-330196 A | 12/2006 | |
| JP | 2007003638 A | 1/2007 | |
| JP | 2007-293105 A | 11/2007 | |
| JP | 09307257 A | 11/2007 | |
| JP | 2007322718 A | 12/2007 | |
| JP | 2008010361 A | 1/2008 | |
| JP | 2008292743 A | 12/2008 | |
| JP | 2010024624 A | 2/2010 | |
| JP | 2010-102227 A | 5/2010 | |
| JP | 2010-282109 A | 12/2010 | |
| JP | 2011-14593 A | 1/2011 | |
| JP | 2011-503663 A | 1/2011 | |
| JP | 2011-75819 A | 4/2011 | |
| JP | 2012-118130 A | 6/2012 | |
| JP | 2012-133254 A | 7/2012 | |
| JP | 2013-537721 A | 10/2013 | |
| JP | 2014-225595 A | 12/2014 | |
| JP | 6039450 B2 | 12/2016 | |
| JP | 2017518526 A | 7/2017 | |
| JP | 2018-511838 A | 4/2018 | |
| JP | 6305564 B2 | 4/2018 | |
| JP | 2019-512721 A | 5/2019 | |
| JP | 6526245 B2 | 5/2019 | |
| JP | 6688402 B2 | 4/2020 | |
| JP | 6824440 B2 | 1/2021 | |
| JP | 6858276 B2 | 3/2021 | |
| KR | 20000000118 U | 1/2000 | |
| KR | 20000047899 A | 7/2000 | |
| KR | 10-2067751 B1 | 1/2002 | |
| KR | 1020040067701 A | 7/2004 | |
| KR | 200366674 Y1 | 11/2004 | |
| KR | 20050033986 A | 4/2005 | |
| KR | 200401354 Y1 | 11/2005 | |
| KR | 20060016469 A | 2/2006 | |
| KR | 10-0563049 B1 | 3/2006 | |
| KR | 20060054742 A | 5/2006 | |
| KR | 10-2006-0070176 A | 6/2006 | |
| KR | 100666961 B1 | 1/2007 | |
| KR | 1020070070675 A | 4/2007 | |
| KR | 10-2007-0048300 A | 5/2007 | |
| KR | 1020070048294 | 8/2007 | |
| KR | 10-2013-0126034 A | 11/2013 | |
| KR | 101764381 B1 | 7/2017 | |
| KR | 10-1847151 B1 | 4/2018 | |
| KR | 10-1853885 B1 | 4/2018 | |
| KR | 10-1868077 B1 | 6/2018 | |
| KR | 10-1885884 B1 | 7/2018 | |
| KR | 10-1894027 B1 | 8/2018 | |
| KR | 10-1904363 B1 | 9/2018 | |
| KR | 10-1958375 B1 | 3/2019 | |
| KR | 10-2010515 B1 | 8/2019 | |
| KR | 10-2063885 | 1/2020 | |
| KR | 10-2104342 B1 | 4/2020 | |
| KR | 10-2109072 B1 | 5/2020 | |
| KR | 10-2165778 B1 | 10/2020 | |
| KR | 10-2262912 B1 | 6/2021 | |
| KR | 10-2267374 B1 | 6/2021 | |
| KR | 10-2306650 B1 | 9/2021 | |
| KR | 10-2379046 B1 | 3/2022 | |
| KR | 10-2400990 B1 | 5/2022 | |
| KR | 10-2501211 B1 | 2/2023 | |
| RU | 2513043 C2 | 4/2014 | |
| WO | WO2005079129 A1 | 8/2005 | |
| WO | WO2007/116117 A1 | 10/2007 | |
| WO | WO2007116116 A1 | 10/2007 | |
| WO | WO2008050660 A2 | 5/2008 | |

(56)                    References Cited

FOREIGN PATENT DOCUMENTS

| | | | |
|---|---|---|---|
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |

OTHER PUBLICATIONS

ITSENCLOSURES, Standard Product Data Sheet, 2011, 18 pages.
SUNBRITETV, All Weather Outdoor LCD Television Model 4610HD, 2008, 1 page.
SUNBRITETV, Introduces Two New All-Weather Outdoor Televisions InfoComm 2008, 7 pages.
ITSENCLOSURES, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.

Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
Civiq Smartscapes, LLC V. Manufacturing Resources International, Inc., Memorandum Opinion re claim construction, Sep. 27, 2018, 16 pages.
Civiq Smartscapes, LLC V. Manufacturing Resources International, Inc., Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Company.
Civic Smartscapes LLC. V Manufacturing Resources International, Inc., Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
Civiq Smartscapes LLC. V Manufacturing Resources International, Inc., Defendant's Amended Answer and Countercliams to Plaintiff's First Amended Complaint, Filed Apr. 24, 2018, 240 pages.
Civiq Smartscapes LLC. V Manufacturing Resources International, Inc., Memorandum Order re "rear surface of the electronic display" term construction, Mar. 5, 2019, 3 pages.
United States International Trade Commission, Manufacturing Resources International, Inc. v Samsung Electronics Co., Ltd et al., In the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.

\* cited by examiner

DOUBLE SIDED DISPLAY ASSEMBLY WITH BI-DIRECTIONAL FLOW THROUGH A COMMON, PARTITIONED HEAT EXCHANGER

CROSS-REFERENCE TO RELATED APPLICATIONS

This application is filed as original and therefore makes no priority claim.

TECHNICAL FIELD

Exemplary embodiments relate generally to double sided display assemblies with bi-directional flow through a common, partitioned heat exchanger as well as systems and methods related to the same.

BACKGROUND AND SUMMARY OF THE INVENTION

Digital out of home (DOOH) advertising is becoming increasingly common. To accomplish such DOOH advertising, electronic displays are sometime placed within ruggedized housings to help the sensitive electronics withstand relatively harsh and varied environmental conditions. This may require at least partial enclosure and/or sealing of such units. The units themselves and/or ambient conditions (e.g., sunlight) may generate heat within the units. As the units may be at least partially sealed, thermal management systems are often needed to maintain internal temperatures and other conditions at acceptable levels, such as to accommodate the relatively sensitive electronic equipment located therein. It is known to use a combination of open loop(s) of ambient air and closed loop(s) of circulating gas to thermally manage displays. Examples of such units and known thermal management systems include the BOLDVU® display assemblies available from Manufacturing Resources International, Inc. of Alpharetta, Georgia (https://mri-inc.net/, Applicant for the Present Application).

Different components and desired unit profiles may require different components and/or component arrangements. For example, differing components and/or arrangements may affect airflow patterns and/or heat loading. This sometimes necessitates various thermal management considerations and designs.

A double-sided display assembly with bi-directional flow through a common, partitioned heat exchanger is provided along with related systems and methods. Side assemblies are connected to a structural framework. The side assemblies may be the same or substantially similar.

Each side assembly includes one or more channels, such as at least one closed loop channel. A rear channel between the side assemblies includes a common heat exchanger. Speta may extend within the rear channel to guide airflow. In exemplary embodiments, fan(s) drive circulating gas through a closed loop airflow pathway such that circulating gas exiting the at least one closed loop channel of a first one of the side assemblies is confined by a first set of one or more septa to travel into a distal portion of a closed loop portion of the heat exchanger before traveling along a rear surface of the second one of the side assembles in an opposing direction to an entrance to the at least one closed loop channel of a second one of the side assemblies. The circulating gas exiting the at least one closed loop channel of the second one of the side assemblies is confined by a second set of one or more septa to travel through a second portion of the closed loop portion of the heat exchanger distal from the second one of the side assemblies before traveling along a rear surface of the first one of the side assembles in an opposing direction to the entrance to the at least one closed loop channel of the first one of the side assemblies. In this fashion, the closed loop airflow pathway forms a loop within the unit. The septa and the heat exchanger may serve to partition the rear channel to separate portions of the loop. The closed loop airflow pathway may form a generally "S" or "Z" shape with parallel S's or Z's, and/or if the S or Z is considered as a bubble type such letter.

The at least one closed loop channel of each of the side assemblies may include a forward channel between a cover and display layer of an electronic display for the side assembly and a secondary channel between an illumination structure and the electronic display layer of the electronic display for the side assembly. While the circulating gas through the forward and rearward channels of a respective side assembly may extend substantially parallel, the flow(s) through the at least one closed loop channel of each respective side assembly may travel in opposing directions. The circulating gas flow(s) through the first and second portions of the closed loop portion of the heat exchanger may travel in opposing directions. The flows through the rear portions of the rear channel may extend in opposing directions.

One or more open loop airflow pathways may include at least one open loop channel provided at each of the side assemblies and an open loop portion of the heat exchanger.

Separations within the closed loop and/or between the closed loop and the ambient environment, any open loop airflow pathways, and/or other portions of the unit need not be perfect. For example, a hermetic seal is not necessarily required. Instead, separation may be in accordance with ingress protection code 65 or higher, for example.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical, similar, or equivalent features, and wherein:

FIG. 1 is perspective view of an exemplary display assembly in accordance with the present invention;

DETAILED DESCRIPTION OF EXEMPLARY EMBODIMENT(S)

Figure 2:
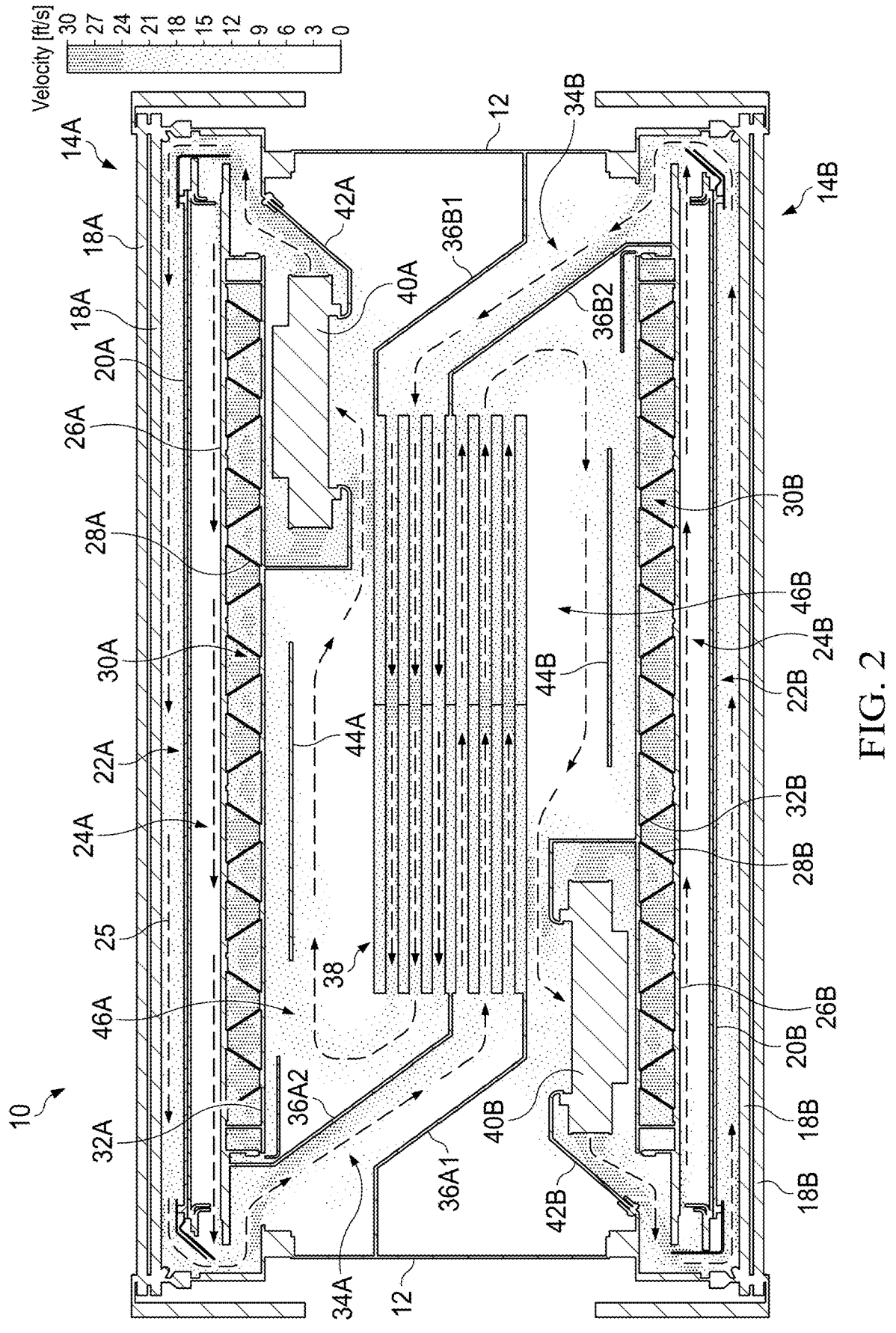
FIG. 2 is a top sectional view taken along section line A-A and illustrating an exemplary airflow pathway and airflow velocities within the display assembly when fans are activated.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
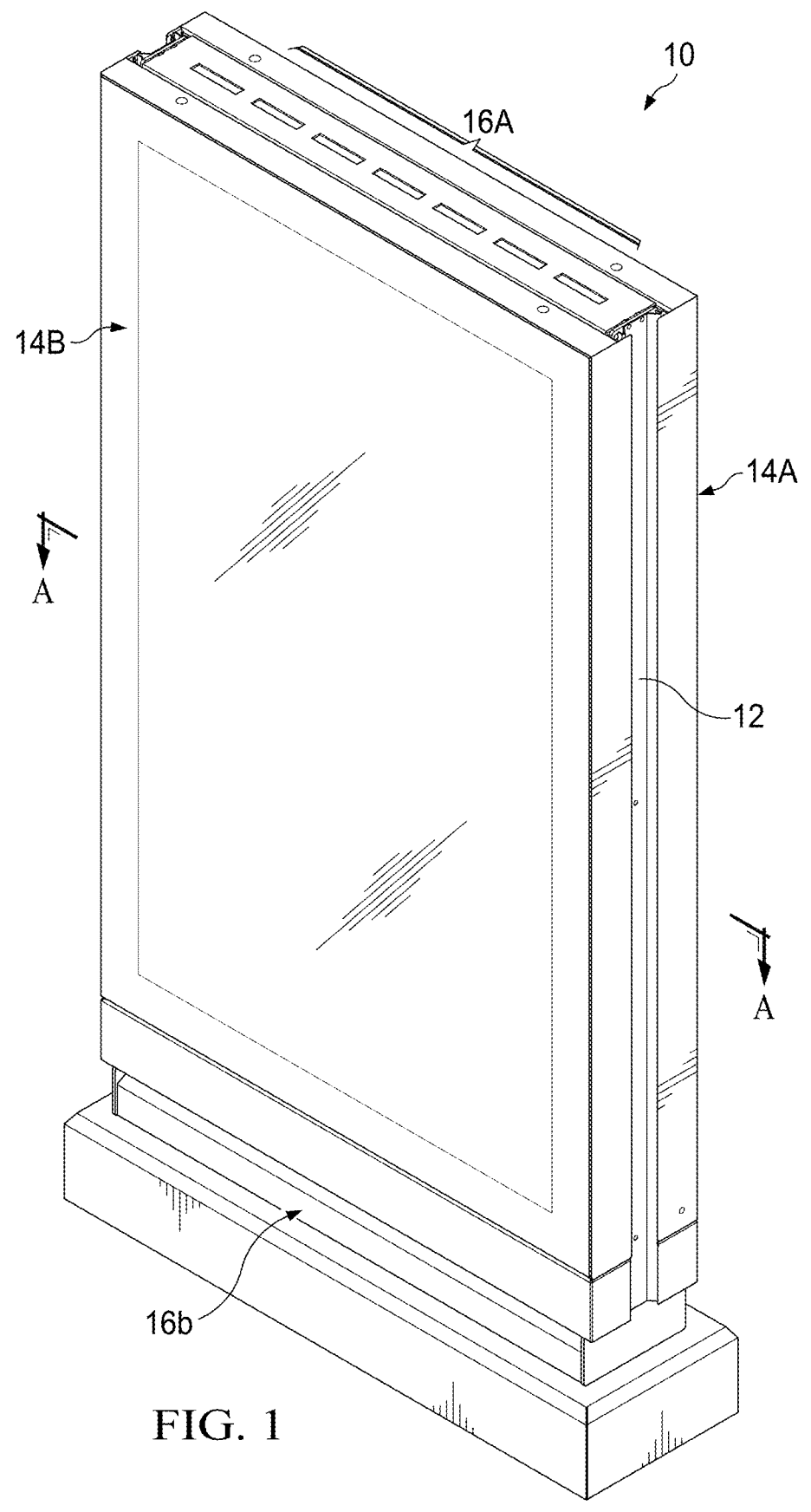

FIG. 1 illustrates an exemplary display unit 10 in accordance with the present invention. The unit 10 may comprise a first side assembly 14A and a second side assembly 14B connected to a structural framework 12. The first and second side assemblies 14A, 14B may be mounted to opposing sides of the framework 12. The framework 12 may include one or more structural members, panels, combinations thereof, or the like. The framework 12 may be configured for mounting to a ground surface (e.g., sidewalk, parking lot, etc.), street furniture (e.g., bus shelter, railing, pole, etc.), combinations thereof, or the like, and/or may incorporate the same.

Any number and/or arrangement of the side assemblies 14 and framework 12 may be utilized. While each side assembly 14 comprises an electronic display in exemplary embodiments, such is not necessarily required. For example, one or more of the side assemblies may include a poster cavity (illuminated or otherwise), door/access panel, combinations thereof, or the like in other exemplary embodiments, while preferably including similar structure (e.g., panels) to provide the associated airflow pathway(s) shown and/or described herein.

In exemplary embodiments, without limitation, the side assemblies 14 are movably mounted to the framework 12, such as by way of hinges located along an upper portion or side of the side assemblies 14 to allow rotation about a substantially (e.g., within 20 degrees) horizontal or vertical axis, gas struts, single or multi-arm linkages, combinations thereof, or the like. This may permit servicing of the unit 10, such as internal components and/or side assemblies 14, including on site servicing, interchange and/or replacement.

Intakes and/or exhausts 16 may be provided at the framework 12 and/or the side assemblies 14 for ingesting and/or exhausting ambient air. For example, without limitation, a common or separate intake(s) 16A may be provided at an upper portion of the framework 12 for the side assemblies 14 and/or heat exchanger 38 while separate, dedicated exhausts 16B are provided at a lower portion of each side assembly 14 and/or the heat exchanger 38. Various common and/or separate intakes and/or exhausts 16 may be utilized for one or more of the side assemblies 14 and/or heat exchanger 38. The number and/or arrangement of intakes/exhausts 16 is exemplary and not intended to be limiting. Internal intakes/exhausts may be provided for moving air into and/or out of each of the side assemblies 14. The intakes and/or exhausts 16 may ingest and/or exhaust ambient air through one or more open loop airflow pathways within the unit 10 as further discussed herein.

Figure 3:
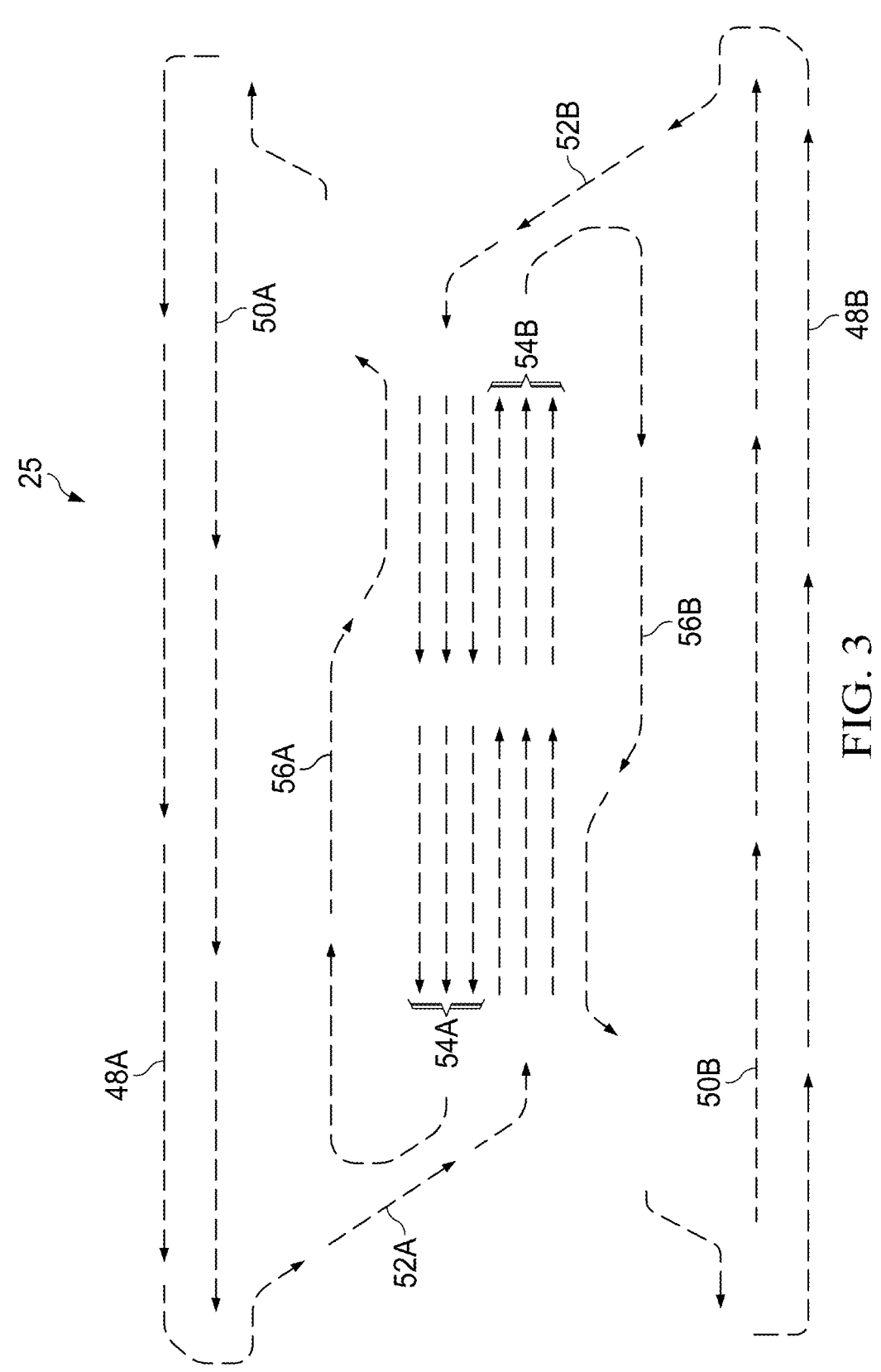
FIG. 3 is the top sectional view of FIG. 2 with the exemplary airflow pathway illustrated in isolation.
Figure 4:
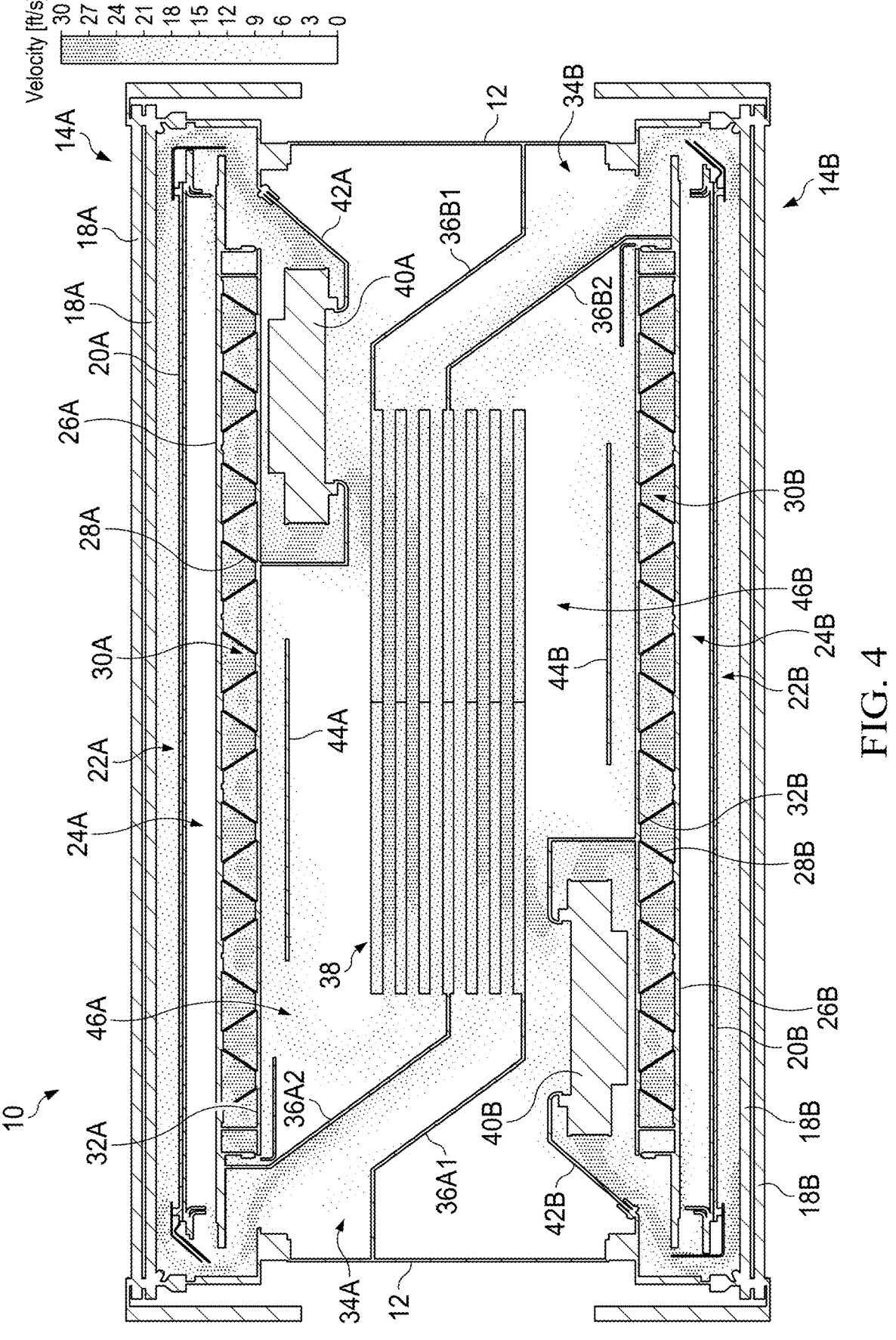
FIG. 4 is the top sectional view of FIG. 2 with exemplary airflow velocities illustrated in isolation.

FIG. 2 through FIG. 4 illustrate exemplary sectional views of the unit 10. More specifically, FIG. 2 illustrates an exemplary sectional view with structural Title: Double Sided Display Assembly with Bi-Directional Flow Through a Common, Partitioned Heat Exchanger components, exemplary airflow velocities, and an exemplary generalized closed loop airflow pathway 25 illustrated. FIG. 3 illustrates the generalized closed loop airflow pathway 25 in isolation for ease of viewing. FIG. 4 illustrates the structural components and exemplary airflow velocities in isolation for ease of viewing.

Each of the side assemblies 14A, 14B may be the same or substantially similar in exemplary embodiments, without limitation. This may reduce part count and make replacement easy. The side assemblies 14A, 14B may be numbered similarly but with an "A" or "B" designator. The side assemblies 14A, 14B and/or their components may be referred to by their base designator herein (e.g., 14A, 14B as 14, 18A, 18B as 18, etc.).

Each of the side assemblies 14 may comprise a cover 18. The covers 18A, 18B may each comprise a single or multiple layers. The covers 18 may be transparent or translucent. The cover 18 layers may comprise glass, acrylic, one or more polymers, combinations thereof, or the like. The covers 18 may comprise one or more polarizers, anti-reflection films, combinations thereof, or the like.

An electronic display layer 20A, 20B may be positioned rearward of each of the covers 18A, 18B, respectively. The electronic display layers 20 may comprise liquid crystals, though other types of electronic displays and/or electronic display layers 20 may be utilized (e.g., OLED). The electronic display layers 20 may be spaced apart from the covers 18 to create forward airflow channels 22A, 22B. In this manner, portions 48A, 48B of the exemplary closed loop airflow 25 may extend within each of the forward airflow channels 22, between the covers 18 and the electronic display layers 20. This portion 48 of the closed loop airflow 25 may reduce heat generated from solar loading experienced at and/or through the cover(s) 18, for example, without limitation.

An illumination structure 26A, 26B may be positioned rearward of each of the electronic display layer 20A, 20B. The illumination structures 26 may comprise backlights for the electronic display layers 20. For example, without limitation, the illumination structures 26 may each comprise one or more substrates (e.g., PCB), each with a number of illumination elements (e.g., LEDs) positioned thereon which, when activated, shine light at and/or through the electronic display layers 20. The illumination structures 26 may be spaced apart from the electronic display layers 20 to create secondary airflow channels 24A, 24B. In this manner, other portions 50A, 50B of the exemplary closed loop airflow 25 may extend within each of the secondary airflow channels 24, between the illumination structures 26 and the electronic display layers 20. This may enhance thermal management and/or control forces provided at the electronic display layers 20. For example, without limitation, this portion 50 of the closed loop airflow 25 may reduce heat generated from illumination structures 26. The illumination structures 26 need not necessarily include illumination elements, such as where self-illuminating electronic displays are utilized (e.g., OLED). The secondary airflow channels 24 may extend at least substantially (e.g., within 20 degrees) parallel with the forward airflow channels 22, at least in part.

In exemplary embodiments, without limitation, the portions 48A, 50A, 48B, 50B of the exemplary closed loop airflow 25 within the respective side assemblies 14A, 14B may extend within each of the forward airflow channels 22A, 22B and secondary Title: Double Sided Display Assembly with Bi-Directional Flow Through a Common, Partitioned Heat Exchanger airflow channels 24A, 24B in at least substantially (e.g., within 20 degrees) opposite directions.

Open loop airflow channels 30A, 30B may be provided in each of the side assemblies 14A, 14B, though such is not necessarily required. Rear panels 32A, 32B may be provided, each of which is located rearward of, and spaced apart from, a respective one of the illumination structure 26A, 26B and/or forms a rear portion of the respective one of the open loop airflow channels 30A, 30B and/or the side assemblies 14A, 14B.

A corrugated layer 28A, 28B may optionally be provided within each of the open loop airflow channels 30A, 30B. The corrugated layer 28 may increase surface area within the channels 30. The open loop airflow channels 30 may be fluidly connected to the intakes/exhausts 16. The open loop airflow channels 30 may provide cooling for the illumination structures 26, which may normally provide a significant heat source, by way of non-limiting example.

Septa 36A1, 36A2, 36B1, 36B2 may extend from the side assemblies 14 and/or framework 12 to direct airflow exiting the forward airflow channels 22 and/or secondary airflow channels 24, which may be at least partially combined, toward a common heat exchanger 38 located between the side assemblies 14. In exemplary embodiments, the common heat exchanger 38 is fixed to the framework 12. The septa 36 may be fixed to one or more of: the common heat exchanger 38, the framework 12, and a respective one of the side assemblies 14. The septa 36 and/or heat exchanger 38 may serve as partitions within the space between the side assemblies 14 and within the framework 12, such as to compartmentalize and/or divide the space. The septa 36 may confine airflow traveling into and/or out of the heat exchanger 38 for example, without limitation.

In exemplary embodiments, a first one of the septa 36A1, 36B1 associated with a respective one of the side assemblies 14A, 14B extends from the respective one of the side assemblies 14A, 14B to the heat exchanger 38 and a second one of the one of the septa 36A2, 36B2 associated with the respective one of the side assemblies 14A, 14B extends from the structural framework 12 to the heat exchanger 38. The septa 36 may extend at non-parallel, non-perpendicular angle(s) relative to a face of the side assemblies 14 in exemplary embodiments, without limitation.

The heat exchanger 38 may comprise a multi-layer heat exchanger. Preferably, the heat exchanger 38 comprises alternating layers for portions 54B, 54A of the closed loop airflow 25 and open loop airflow. Preferably, the alternating layers are arranged for flow primarily in generally (e.g., within 20 degrees) perpendicular directions from one another. For example, without limitation the closed loop airflow 25 may travel primarily in a generally horizontal direction while open loop airflow may travel primarily in a generally vertical direction.

In exemplary embodiments, without limitation, the partitions 36 may direct the airflow to a distal portion of heat exchanger 38 relative to the respective side assembly 14 from which the airflow is exiting. The airflow 54B may flow through one or more layers of the heat exchanger 38. One or more of the layers of the heat exchanger 38, and/or the septa 36, may serve to separate a first portion 54B of the closed loop airflow 25 exiting the first side assembly 14A from a second portion 54A of the closed loop airflow 25 exiting the second side assembly 14B such that the first and second portions 54A, 54B of the closed loop airflow 25 within the heat exchanger 38 are provided in a generally counter flow type arrangement.

Airflow exiting the heat exchanger 38 may be at least partially recombined and extend through rear channels 46A 46B located rearward of the side assemblies 14A, 14B, within the framework 12, and outside of the heat exchanger 38. Such travel may be further confined and/or directed, at least in part, by the septa 36. In exemplary embodiments, without limitation, these portions 56A, 56B of the closed loop airflow 25 may extend over and/or under electronic components 44A, 44B. The electronic components 44A, 44B comprise one or more electronics (e.g., microchips, power supplies, video players, network connectivity devices, sensors, combinations thereof, or the like). The electronic components 44A, 44B may be mounted to substrates which are connected to, and spaced apart from, the rear panels 32. In other exemplary embodiments, without limitation, the electronic components 44A, 44B are directly mounted to the rear panels 32. The general bend in the closed loop airflow pathway 25 from the heat exchanger 38 to the fans 40 may cause the portion 56 of the circulating gas in the closed loop airflow pathway 25 to contact the electronic components 44 and/or a rear surface of the open loop channel 30 and/or rear panel 32, such as to enhance heat transfer.

In exemplary embodiments, septa 36A1 and 36A2 define, at least in part, a first channel 34A for a portion 52A of the closed loop airflow 25 exiting the forward airflow channel 22A and/or the secondary airflow channel 24A of the first side assembly 14A and entering a first portion of the common heat exchanger 38 as airflow portion 54A. Septa 36A1 may extend from a portion of the framework 12 forming a first side of the unit 10 to a layer of the common heat exchanger 38 proximate to the first side assembly 14A. Septa 36A2 may be spaced apart from septa 36A1. Septa 36A2 may extend from the illumination structure 26A of the first side assembly 14A to a mid-layer of the common heat exchanger 38 separating the first and second airflow portions 54A, 54B within the common heat exchanger 38. Septa 3681 and 3682 may define, at least in part, a second channel 34B for a portion 52B of the closed loop airflow 25 exiting the forward airflow channel 22B and/or the secondary airflow channel 24B of the second side assembly 14B and entering a second portion of the common heat exchanger 38 as airflow portion 54B.

Septa 36B1 may extend from a portion of the framework 12 forming a second side of the unit 10 to a layer of the common heat exchanger 38 proximate to the second side assembly 14B. Septa 36B2 may be spaced apart from septa 36B1. Septa 3682 may extend from the illumination structure 26B of the second side assembly 14B to the mid- layer of the common heat exchanger 38 separating the first and second airflow portions 54A, 54B within the common heat exchanger 38. Septa 36A1, 36A2 may be on opposing sides of the common heat exchanger 38 from septa 3681, 36B2.

One or more fans 40A, 40B may be provided within each of the rear channels 46A, 46B. For example, without limitation, each of the fans 40 may be connected to the rear panel 32 of the respective side assembly 14. The fans 40 may comprise a housing 42 that preferably extends between an entrance to the respective fan 40 and the respective side assembly 14, such as to guide the circulating air exiting the Title: Double Sided Display Assembly with Bi-Directional Flow Through a Common, Partitioned Heat Exchanger fan 40 towards the respective forward channel 22 and secondary channel 24 of the respective side assembly 14. In exemplary embodiments, without limitation, the fans 40 comprise centrifugal type fans, though such is not necessarily required.

The open loop airflows extending within the unit 10, such as within the open loop airflow channels 30A, 30B and heat exchanger 38 may be entirely separate and have separate intakes and/or exhausts 16, for example, or may be common, at least in part, any may share at least some of the intakes and/or exhausts 16.

The closed loop airflow pathways 25 illustrated is intended to convey a generalized, exemplary flow pathway and/or airflow velocities.

While the terms closed loop, circulating gas, or similar are sometimes used herein, the display unit 10, airflow pathways, and/or individual passageways, channels, etc. need not necessarily be hermetically sealed. Preferably, the separation between a least the closed loop airflow pathways 25 and the open loop airflow pathway(s) and/or ambient environment is sufficient to meet or exceed one or more of ingress protection (IP) 65, 66, 67, or more stringent, such as in accordance with the standards advanced by the International Electrotechnical Commission of Geneva, Switzerland (https://www.iec.ch/ip-ratings). Gaskets, caulking, solid materials, combinations thereof, or the like may be used to accomplish such separation and/or sealing.

The open loop airflow pathway(s) may be those in direct fluid connection with the ambient environment.

The disclosed embodiment(s) may facilitate adequate thermal management (e.g., cooling) during normal operations for a wide variety of environmental conditions. Alternatively, or additionally, the disclosed embodiment(s) may facilitate a relatively small footprint and/or occupation of space, which may be particularly important for installation in a small space (e.g., narrow sidewalk) or otherwise congested population center which space is highly valued. The disclosed embodiment(s) may be particularly suitable for relatively narrow, elongated units 10, by way of non-limiting example, which may otherwise provide insufficient surface area for heat exchange.

Alternatively, or additionally, the disclosed units 10 may not require any pass-through devices for the closed loop airflow pathway 25, at least, which can be difficult to adequately seal and provide certain complexities in manufacturing and/or maintenance.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention.

Certain operations described herein may be performed by one or more electronic devices. Each electronic device may comprise one or more processors, electronic storage devices, executable software instructions, combinations thereof, and the like configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by one or more wired or wireless connectively components (e.g., routers, modems, ethernet cables, fiber optic cable, telephone cables, signal repeaters, and the like) and/or networks (e.g., internets, intranets, cellular networks, the world wide web, local area networks, and the like). The computerized hardware, software, components, systems, steps, methods, and/or processes described herein may serve to improve the speed of the computerized hardware, software, systems, steps, methods, and/or processes described herein. The electronic devices, including but not necessarily limited to the electronic storage devices, databases, controllers, or the like, may comprise and/or be configured to hold, solely non-transitory signals.

What is claimed is:

1. A display assembly comprising:
a structural framework;
a first and second side assembly, each connected to the structural framework and comprising a cover, an electronic display, at least one open loop channel and at least one closed loop channel;
a heat exchanger positioned between the first and second side assemblies and within the structural framework and comprising a closed loop portion and an open loop portion;
a closed loop airflow pathway comprising:
a first portion comprising the at least one closed loop channel of the first side assembly;
a second portion extending between the first portion and a third portion, the second portion comprising a first portion of the closed loop portion of the heat exchanger, which is distal from the first side assembly;
the third portion extending between the second portion and a fourth portion, the third portion comprising the at least one closed loop channel of the second side assembly; and
the fourth portion extending to the first portion and comprising a second portion of the closed loop portion of the heat exchanger, which is distal from the second side assembly;
one or more open loop airflow pathways comprising the at least one open loop channel of each of the side assemblies and the open loop portion of the heat exchanger;
and one or more fans located along the closed loop airflow pathway, which when activated, move circulating gas through the closed loop airflow pathway, including through the first portion of the closed loop portion of the heat exchanger in a first direction and through the second portion of the closed loop portion of the heat exchanger in a second direction opposing the first direction.

2. A display assembly comprising:
a structural framework;
side assemblies, each connected to the structural framework and comprising a cover, an electronic display, and one or more channels;
a heat exchanger positioned between the side assemblies and within the structural framework; and
a closed loop airflow pathway comprising:
a first portion comprising at least one of the one or more channels of a first one of the side assemblies;
a second portion extending between the first portion and a third portion of the closed loop airflow pathway, said second portion comprising a first portion of the heat exchanger, distal from the first one of the side assemblies;
the third portion extending between the second portion and a fourth portion of the closed loop airflow pathway, said third portion comprising at least one of the one or more channels of a second one of the side assemblies;

the fourth portion extending to the first portion of the closed loop airflow pathway and comprising a second portion of the heat exchanger, distal from the second one of the side assemblies; and one or more fans, which when activated, move circulating gas through the closed loop airflow pathway, including through the first portion of the heat exchanger in a first direction and through the second portion of the heat exchanger in a second direction opposing the first direction.

3. The display assembly of claim 1 wherein:

said one or more fans are configured to, when activated, move said circulating gas through the at least one of the one or more channels of the first one of the side assemblies in the second direction before entering the first portion of the heat exchanger, and through the at least one of the one or more channels of the second one of the side assemblies in the first direction before entering the second portion of the heat exchanger.

4. The display assembly of claim 3 further comprising:

a first set of one or more septa extending from an exit of each of the at least one of the one or more channels of the first one of the side assemblies to the first portion of the heat exchanger; and a second set of one or more septa extending from an exit of each of the at least one of the one or more channels of the second one of the side assemblies to the second portion of the heat exchanger.

5. The display assembly of claim 4 wherein:

the first set of one or more septa comprises a first septa extending from the first one of the side assemblies to the heat exchanger and a second septa extending from the structural framework to the heat exchanger; and the second set of one or more septa comprises a third septa extending from the second one of the side assemblies to the heat exchanger and a fourth septa extending from the structural framework to the heat exchanger.

6. The display assembly of claim 4 further comprising:

a rear channel provided between the side assemblies and within the structural framework, wherein said rear channel is partitioned into a first portion extending along a rear surface of the first one of the side assemblies and a second portion extending along a rear surface of the second one of the side assemblies by the heat exchanger and at least some of the septa, and wherein said heat exchanger is located within the rear channel.

7. The display assembly of claim 6 wherein:

the first set of one or more septa partition the rear channel into a third portion extending from an exit of the at least one of the one or more channels of the first one of the side assemblies to the first portion of the heat exchanger; and the second set of one or more septa partition the rear channel into a fourth portion extending from an exit of the at least one of the one or more channels of the second one of the side assemblies to the second portion of the heat exchanger.

8. The display assembly of claim 6 wherein:

said one or more fans are configured to, when activated, move said circulating gas through the first portion of the rear channel in the first direction and the second portion of the rear channel in the second direction.

9. The display assembly of claim 8 wherein:

the first portion of the rear channel is fluidly interposed between the second portion of the heat exchanger and the at least one channel of the first one of the side assemblies; and the second portion of the rear channel is fluidly interposed between the first portion of the heat exchanger and the at least one channel of the second one of the side assemblies.

10. The display assembly of claim 6 further comprising:

a first set of one or more electronic components for operating the first one of the side assemblies located within the first portion of the rear channel; and a second set of one or more electronic components for operating the second one of the side assemblies located within the second portion of the rear channel.

11. The display assembly of claim 2 wherein:

each of the one or more fans comprises a first set of one or more fans connected to a first one of the side assemblies and a second set of one or more fans connected to a second one of the side assemblies.

12. The display assembly of claim 11 wherein:

each of the one or more fans comprises a centrifugal type fan blade and a fan housing extending about at least part of the respective one of the fan blades and over an entrance to the at least one channel of the respective one of the side assemblies to which the respective one of the fans is connected.

13. The display assembly of claim 2 wherein:

the electronic display of each of the side assemblies comprises an electronic display layer located rearward of, and spaced part from, the cover; and the at least one of the one or more channels of each of the side assemblies comprises a forward channel located between the cover and the electronic display layer of the respective one of the side assemblies.

14. The display assembly of claim 13 wherein:

the electronic display of each of the side assemblies comprises an illumination structure located rearward of, and spaced part from, the electronic display layer; and the at least one of the one or more channels of each of the side assemblies comprises a secondary channel located between the illumination structure and the electronic display layer of the respective one of the side assemblies.

15. The display assembly of claim 14 wherein:

the electronic display layer of each of the side assemblies comprises a liquid crystal type display; and the illumination structure of each of the side assemblies comprises a direct backlight for the electronic display layer of the respective one of the side assemblies; and said direct backlight of each of the side assemblies comprises a printed circuit board and a number of light emitting diodes.

16. The display assembly of claim 2 further comprising:

one or more open loop airflow pathways comprising a third portion of the heat exchanger.

17. The display assembly of claim 16 wherein:

the one or more channels of each of the side assemblies comprises an open loop channel located along a rear surface of the illumination structure;

the open loop channel of each of the side assemblies forms part of the one or more open loop airflow pathways; and the heat exchanger comprises layers which alternate between forming part of the one or more open loop airflow pathways and the closed loop airflow pathway.

18. The display assembly of claim 16 wherein:

the closed loop airflow pathways are separate from an ambient environment and the one or more open loop airflow pathways in accordance with at least ingress protection code 65.

19. An electronic displays apparatus, comprising:

two individual electronic displays configured in a back-to-back arrangement in a housing;

a shared heat exchanger positioned between the two displays, and within the housing;

at least one fan in the first of the two displays and at least another fan in the second of the two displays; and a pathway for cooling air to circulate inside the displays and the housing, said pathway defined to comprise the route cooling air is enabled to travel through said apparatus in the space between a cover glass and display panel on the first of the two displays, then through a first portion of the heat exchanger in a first direction, exiting the heat exchanger and circulating between a cover glass and the display panel of the second of the two displays, then through a second portion of the heat exchanger in a second direction opposite of said first direction, then back to the first of the two displays, such that during operation of said fans the cooling air continues in a continuous cooling air stream in the pathway.

\* \* \* \* \*